United States Patent [19]

Hays

[11] Patent Number: 5,509,974
[45] Date of Patent: Apr. 23, 1996

[54] ETCH CONTROL SEAL FOR DISSOLVED WAFER PROCESS

[75] Inventor: Kenneth M. Hays, Anaheim, Calif.

[73] Assignee: Rockwell International Corporation, Seal Beach, Calif.

[21] Appl. No.: 434,153

[22] Filed: May 2, 1995

Related U.S. Application Data

[63] Continuation-in-part of Ser. No. 229,501, Apr. 19, 1994, Pat. No. 5,437,739.

[51] Int. Cl.$^6$ ............................................. H01L 29/12
[52] U.S. Cl. ....................... 148/33.3; 216/2; 216/99; 437/974; 148/DIG. 12
[58] Field of Search ................................. 216/2, 11, 34, 216/79, 99; 437/974; 148/DIG. 12, 33.3

[56] References Cited

U.S. PATENT DOCUMENTS

| | | | |
|---|---|---|---|
| 4,465,549 | 8/1984 | Ritzman | 156/633 |
| 4,523,964 | 6/1985 | Wilner et al. | 148/33.3 |
| 4,962,062 | 10/1990 | Uchiyama et al. | 148/DIG. 12 |

FOREIGN PATENT DOCUMENTS

| | | |
|---|---|---|
| 02161748 | 6/1990 | Japan . |
| 03265154 | 11/1991 | Japan . |
| 05226483 | 9/1993 | Japan . |

OTHER PUBLICATIONS

Bernstein et al, "A Micromachined Comb–Drive Tuning Fork Rate Gyroscope", IEEE Proceedings on Micro Electro Mechanical Systems, pp. 148–148, Feb. 7, 1993.

Primary Examiner—George Fourson
Assistant Examiner—Thomas G. Bilodeau
Attorney, Agent, or Firm—John C. McFarren

[57] ABSTRACT

A dissolved wafer process is modified by providing an etch control seal around the perimeter of an etch resistant microstructure, such as a micromechanical or microelectromechanical device, formed on a first substrate. The microstructure is defined and shaped by a surrounding trench in the first substrate. Selected areas of the microstructure and the first substrate are bonded to an etch resistant second substrate. The selected bonding areas may comprise raised areas of the first substrate, or raised areas of the second substrate corresponding to the selected bonding areas of the first substrate. A bonded area forming a ring extending around the perimeter of the microstructure and its defining trench forms an etch control seal. The first substrate of the bonded assembly is dissolved in a selective etch so that the etch resistant microstructure remains attached to the second substrate only at the bonded areas. The etch control seal reduces exposure of the microstructure to the etch by preventing the etch from contacting the microstructure until the etch leaks through the dissolving floor of the trench. This occurs only during the final stages of the wafer dissolution step, thus minimizing exposure of the microstructure to the damaging effects of the etch.

15 Claims, 3 Drawing Sheets

ETCH CONTROL SEAL FOR DISSOLVED WAFER PROCESS

This application is a continuation-in-part of U.S. application Ser. No. 08/229,501, filed Apr. 19, 1994, now U.S. Pat. No. 5,437,739, issued Aug. 1, 1995.

TECHNICAL FIELD

The present invention relates to dissolved wafer micromachining processes and, in particular, to a perimeter seal that limits exposure of microstructures to the selective etch used during a dissolved wafer process.

BACKGROUND OF THE INVENTION

FIGS. 1–3 illustrate a conventional dissolved wafer process for fabricating a microstructure, such as a micromechanical or microelectromechanical structure (MEMS), on a substrate 10. As shown in FIG. 1, an intricately patterned, heavily doped microstructure 12, which comprises a simplified microelectromechanical resonator as an example, is formed on a substrate 10 comprising silicon, germanium, gallium arsenide, or other microscopically machinable material. Microstructure 12 may be formed using conventional masking, etching, diffusion, ion implantation, and epitaxial growth techniques. In one technique, the top surface 11 of substrate 10 is heavily doped with a selected dopant to a desired depth, as best illustrated in FIG. 2. The shape of structure 12 can then be defined by trenches 14 in substrate 10 using reactive ion etching, wet chemical etching, or other conventional techniques. Trenches 14 penetrate substrate 10 to below the depth of heavy doping and surround the region forming heavily doped structure 12. Selected raised areas 16 of heavily doped structure 12 are formed by reactive ion etching, wet chemical etching, or other conventional etching or patterned layer deposition techniques that may be performed prior or subsequent to the steps used to form structure 12. Raised areas 16 are subsequently bonded to a second substrate 18, as shown in FIG. 2. FIG. 2 is a cross section of substrate 10 taken along the section lines 2—2 of FIG. 1, with the addition of second substrate 18 bonded atop substrate 10 at raised areas 16. Substrate 18 may comprise any material or combination of materials that can be bonded to raised areas 16 and that resist the selective etch used to dissolve substrate 10. The bonding operation can be accomplished using any conventional technique or combination of techniques such as anodic bonding, optical contacting, thermal bonding, pressure bonding, or soldering, for example. After substrate 18 is bonded to raised areas 16, substrate 10 is dissolved in a selective etch, such as hydrazine or ethylenediamine pyrocatechol (EDP) for silicon substrates, for example. The doped regions 12 and 16, which form the resonator, resist dissolving in the selective etch. After first substrate 10 has dissolved down to trenches 14, microstructure 12 is released from first substrate 10 but it remains bonded to second substrate 18 at raised areas 16, as shown in FIG. 3. This allows structure 12 to function as a microelectromechanical resonator. Heavily doped areas 11 of substrate 10 that are not bonded to substrate 18 simply fall away from structure 12 after substrate 10 has dissolved.

Because heavily doped microstructure 12 is bonded to second substrate 18 only at selected areas 16 and is surrounded by a gap between the two substrates, microstructure 12 and the surfaces of substrate 18 to which it is bonded are exposed to the selective etch for the duration of its application to dissolve first substrate 10. Although the heavily doped material of structure 12 and the material of substrate 18 resist the selective etch, they are nevertheless attacked by the etch to some degree. This undesirable effect limits design flexibility of microstructures and leads to poor device yield. Therefore, improved techniques are needed to increase design flexibility and improve the yield of micromechanical and microelectromechanical devices fabricated by dissolved wafer processes.

SUMMARY OF THE INVENTION

A dissolved wafer process is modified by providing an etch control seal around the perimeter of an etch resistant microstructure, such as a micromechanical or microelectromechanical device, formed on a first substrate using conventional methods, as described above. The microstructure is defined by a trench in the first substrate that surrounds and defines the shape of the microstructure. Selected areas of the microstructure and the first substrate are bonded to an etch resistant second substrate. The selected bonding areas may comprise raised areas of the first substrate. Alternatively, the selected bonding areas of the first substrate may be bonded to corresponding raised areas of the second substrate. The etch control seal of the present invention comprises a bonded area forming a ring extending around the perimeter of the microstructure and its defining trench. A selective etch is then used to dissolve the first substrate so that the etch resistant microstructure remains attached to the second substrate only at the bonded areas. The etch control seal reduces exposure of the microstructure to the etch by preventing the etch from contacting the microstructure until the etch leaks through the dissolving floor of the trench. This occurs only during the final stages of the wafer dissolution step, thus minimizing exposure of the microstructure to the damaging effects of the etch.

A principal object of the invention is fabrication of high quality microstructures. A feature of the invention is an etch control seal that reduces exposure of microstructures to the selective etch in a dissolved wafer process. An advantage of the invention is increased design flexibility and improved microstructure yield and quality in a dissolved wafer process.

BRIEF DESCRIPTION OF THE DRAWINGS

For a more complete understanding of the present invention and for further advantages thereof, the following Detailed Description of the Preferred Embodiments makes reference to the accompanying Drawings, wherein like reference numerals indicate the same or similar elements throughout the various Figures, in which.

DETAILED DESCRIPTION OF THE PREFERRED EMBODIMENTS

Figure 1:
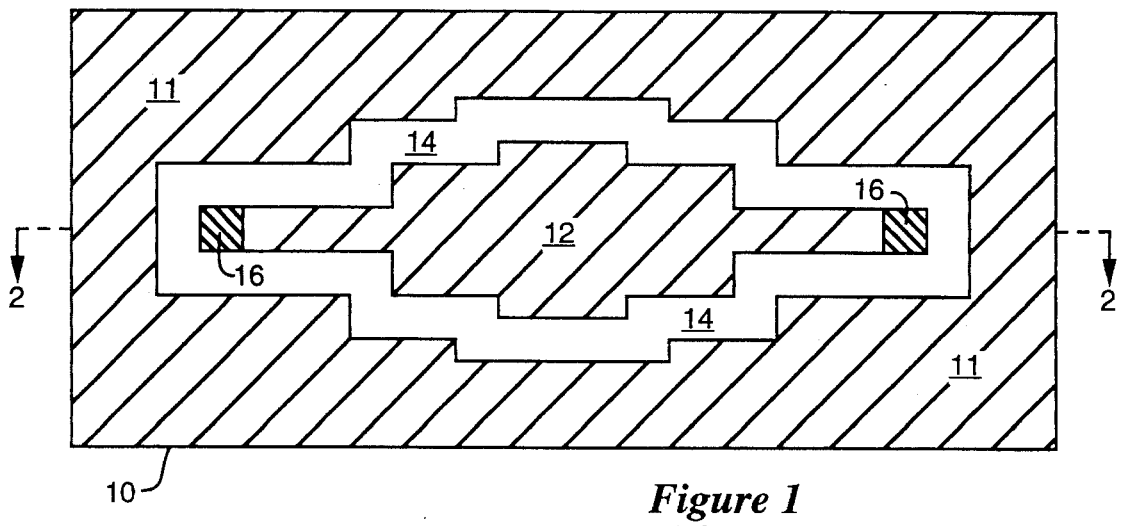
FIG. 1 is a top plan view of a prior art microstructure formed on a substrate.
Figure 2:
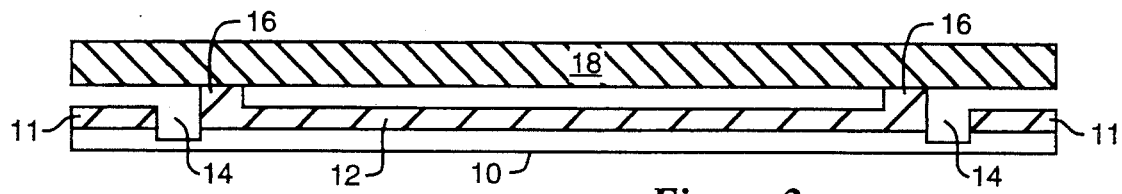
FIG. 2 is a cross-sectional view of the prior art substrate and microstructure of FIG. 1 bonded to a second substrate.
Figure 3:
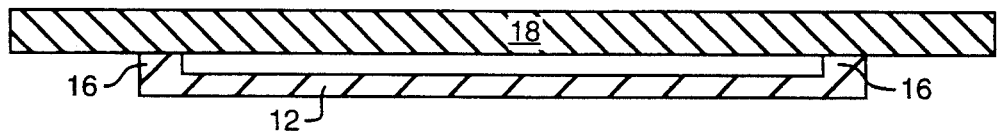
FIG. 3 is a cross-sectional view of the microstructure of FIG. 2 after dissolution of the first substrate.
Figure 4:
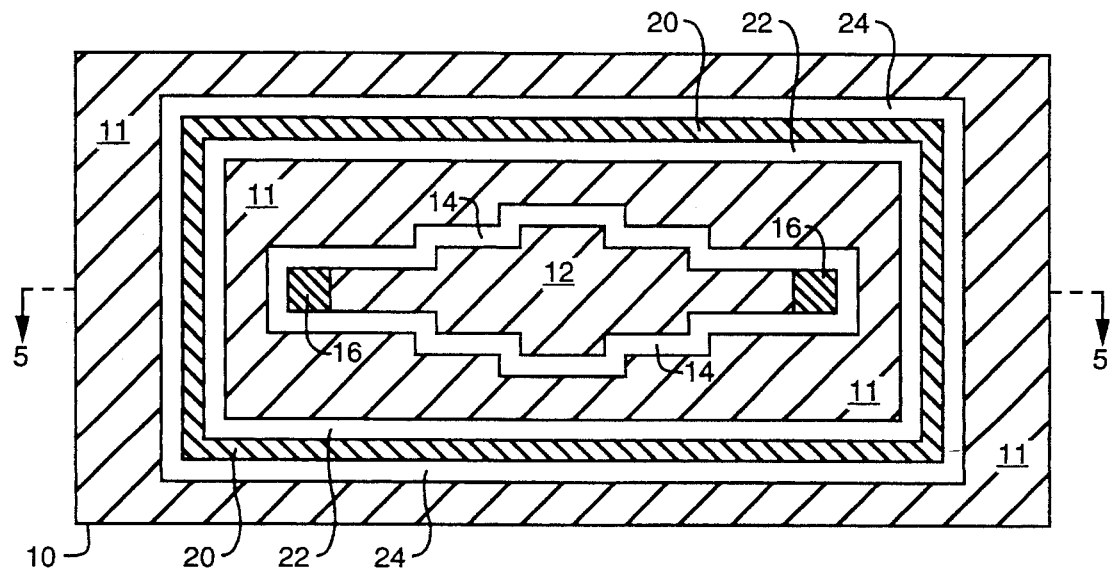
FIG. 4 is a top plan view of a microstructure and a first embodiment of an etch control seal of the present invention formed on a substrate.
Figure 5:
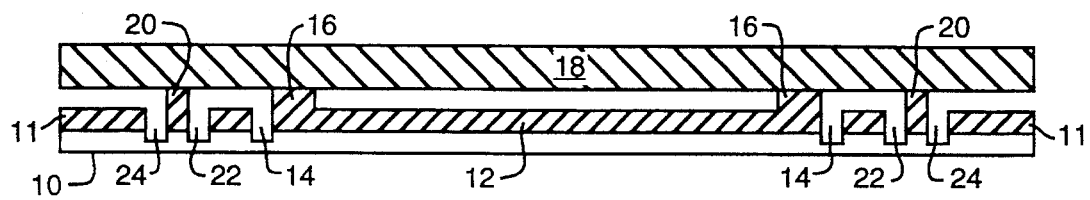
FIG. 5 is a cross-sectional view of the microstructure and etch control seal of FIG. 4 bonded to a second substrate.
Figure 6:
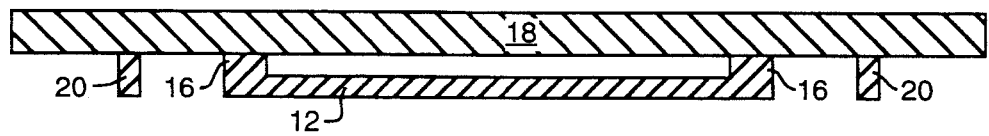
FIG. 6 is a cross-sectional view of the microstructure of FIG. 5 bonded to the second substrate after dissolution of the first substrate.

Substrate 10 and microstructure 12, described above in conjunction with FIGS. 1–3, are illustrated in FIGS. 4–6 in combination with one embodiment of an etch control seal 20 of the present invention. As shown in FIG. 4, etch control seal 20, which is surrounded on both sides by trenches 22 and 24, respectively, extends around the entire perimeter of microstructure 12 and its defining trench 14. Seal 20 and trenches 22 and 24 can be formed using the same patterning steps used to form microstructure 12 and its defining trench 14. In some embodiments trenches 14 and 22 can form a single trench etched in substrate 10 between microstructure 12 and seal 20, and trench 24 may comprise a trench, similar to trench 22 or 14, for a neighboring microstructure on substrate 10 sharing a common wall of seal 20. Seal 20 typically comprises the same material (such as heavily doped surface 11, for example) that forms microstructure 12 and raised areas 16 and which resists the effects of the wafer dissolving selective etch. In alternative embodiments, seal 20 may comprise other etch resistant materials that are compatible with substrates 10 and 18 and the bonding process. As best shown in cross section in FIG. 5, seal 20 comprises a flat ring raised above the remainder of heavily doped surface 11 of substrate 10 to the same extent as raised areas 16 of microstructure 12. Before dissolution of substrate 10, second substrate 18 is bonded to raised areas 16 of microstructure 12 and to the top of etch control seal 20 around the entire perimeter of structure 12, as shown in the cross section of FIG. 5.

The bonded assembly illustrated in FIG. 5 is then exposed to a selective etch as described above in conjunction with FIG. 2. When compared with the assembly of FIG. 2, it can be seen that seal 20 in FIG. 5 prevents the dissolving etch from entering the gap between microstructure 12 and substrate 18 (and around bonded raised areas 16) until the final stages of the dissolution of substrate 10. The selective etch only comes into contact with microstructure 12 and areas 16 when the etch leaks through the dissolving floors of trenches 14 and 22. This occurs only during the last stages of the dissolution of substrate 10 so that microstructure 12 and bonded areas 16 receive minimal exposure to the damaging effects of the dissolving etch. Seal ring 20 also prevents the flowing of etch fluids between the bonded pair of substrates 10 and 18 during dissolution of substrate 10. Dissolving substrate 10 becomes very thin and flexible during the final minutes of dissolution, and etch fluids flowing between the substrates can tear apart the wafers and the bonded microstructures 12.

As an alternative to (or in addition to) surrounding each microstructure with an etch control ring 20 as shown in FIGS. 4–6, ring 20 may be constructed around a group or cluster of devices, and several rings may share common walls, as in an ice tray. To minimize the wafer surface area used by etch control seals, a seal ring may be constructed around the entire perimeter of the wafer surface. Seal rings can also be placed along wafer saw streets to reduce or eliminate the need to use scarce device surface area for seal rings.

Figure 7:
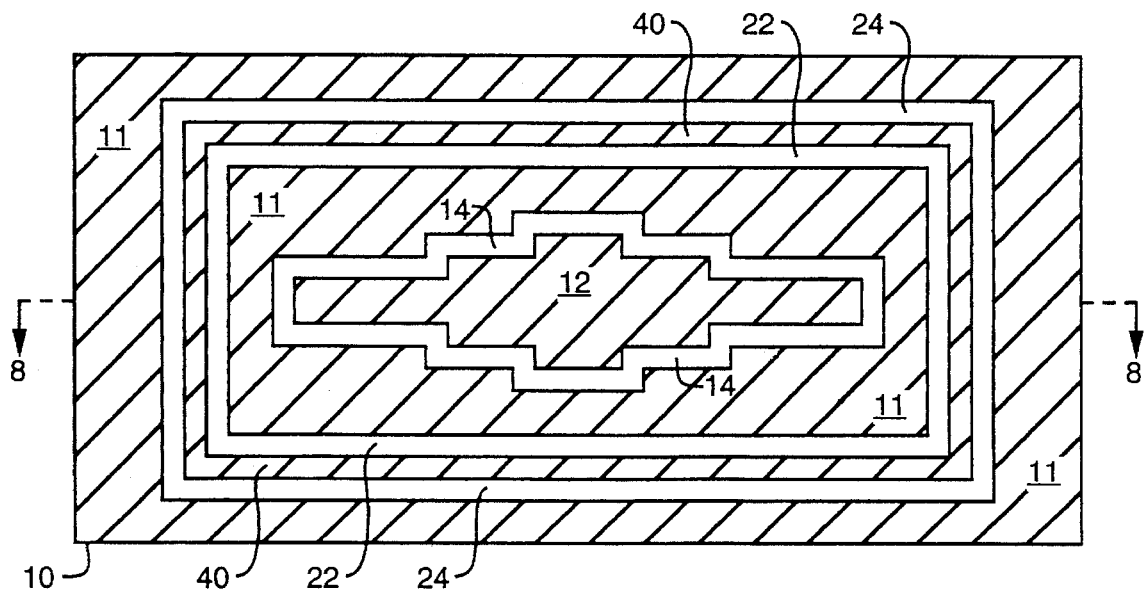
FIG. 7 is a top plan view of a microstructure formed on a first substrate before bonding to a second substrate having an alternative embodiment of the etch control seal of the present invention.
Figure 8:
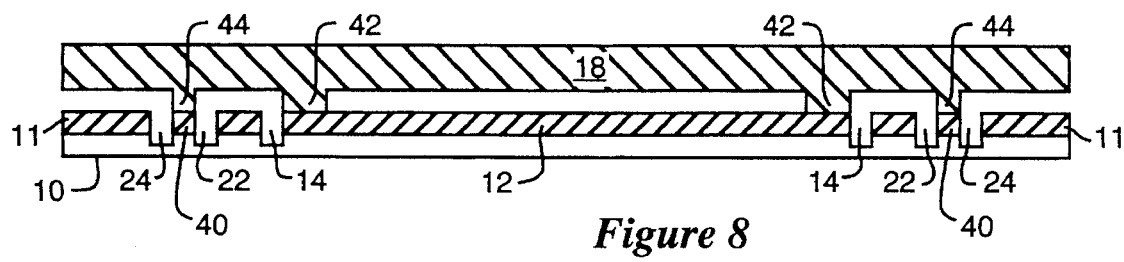
FIG. 8 is a cross-sectional view of the microstructure of FIG. 7 bonded to the second substrate having the etch control seal.
Figure 9:
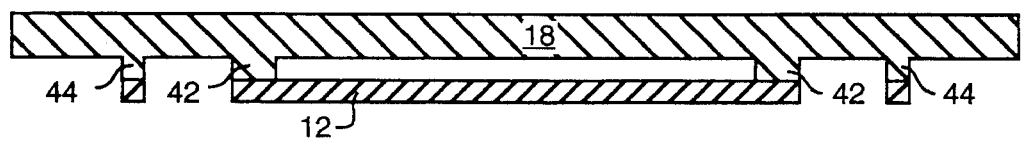
FIG. 9 is a cross-sectional view of the microstructure of FIG. 8 bonded to the second substrate after dissolution of the first substrate.

An alternative embodiment of the etch control seal of the present invention is illustrated in FIGS. 7–9. As shown in FIG. 7, microstructure 12 may be formed on surface 11 of substrate 10, as described above, but without raised areas 16 and raised ring 20. A bonding area 40, which takes the place of ring 20 and is surrounded on both sides by trenches 22 and 24, respectively, extends around the entire perimeter of microstructure 12 and its defining trench 14. Bonding area 40 and trenches 22 and 24 can be formed using the same patterning steps used to form microstructure 12 and its defining trench 14. As described above, trenches 14 and 22 can form a single trench etched in substrate 10 between microstructure 12 and bonding area 40, and trench 24 may comprise a trench, similar to trench 22 or 14, for a neighboring microstructure on substrate 10 sharing a common bonding area 40. Bonding area 40 typically comprises the same material as microstructure 12 that resists the effects of the wafer dissolving selective etch. As stated above, bonding area 40 may also comprise other etch resistant materials that are compatible with substrates 10 and 18 and the bonding process.

In this alternative embodiment, second substrate 18 is prepared with raised areas 42 and 44, best illustrated in the cross section of FIG. 8. Raised areas 42 and 44 of substrate 18 may be formed by conventional masking and etching or deposition techniques. Raised areas 42 correspond to the areas of microstructure 12 selected for bonding to substrate 18. Raised areas 44 form a raised ring corresponding to bonding area 40 of first substrate 10. Before dissolution of substrate 10, raised areas 42 and 44 of second substrate 18 are bonded to the corresponding bonding areas 40 and selected bonding areas of microstructure 12 to form a bonded assembly. When raised ring 44 of substrate 18 is bonded to bonding area 40 of substrate 10, ring 44 forms an etch control seal around the entire perimeter of microstructure 12. In some cases, this embodiment of the invention, with raised areas 42 and 44 on second substrate 18 (rather than raised area 16 and seal ring 20 on first substrate 10), may facilitate the fabrication of microstructure 12 and associated trenches 14, 22, and 24 on the first substrate 10.

The bonded assembly illustrated in FIG. 8 is exposed to the selective etch as described above in conjunction with FIGS. 2 and 5. When compared with the assembly of FIG. 5, it can be seen that the bonding of raised ring 44 of substrate 18 to bonding area 40 of substrate 10 forms an etch control seal, similar to seal 20 in FIG. 5, that prevents the dissolving etch from entering the gap between microstructure 12 and substrate 18 (and around bonded areas 42) until the final stages of the dissolution of substrate 10. The selective etch only comes into contact with microstructure 12 when the etch leaks through the dissolving floors of trenches 14 and 22. This occurs only during the last stages of the dissolution of substrate 10 so that microstructure 12 and bonded areas 42 receive minimal exposure to the damaging effects of the dissolving etch. The etch control seal formed by bonded areas 40 and 44 also prevents the flowing of etch fluids between the bonded pair of substrates 10 and 18 during dissolution of substrate 10, as described above.

In addition to protecting microstructures from attack by the selective etch during dissolution of the first substrate, bonded seal rings also increase the total surface area of the first substrate bonded to the second substrate. This makes a bonded pair of substrates a much stronger assembly. Handling, storage, and processing characteristics of the bonded assembly, particularly during fabrication steps performed between the time the substrates are joined and the time the first substrate is completely dissolved, are thus improved. This is an important advantage for typical micromechanical designs that have bond joints with small surface areas.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

I claim:

1. An etch control seal for a microstructure fabrication process, comprising:

a first substrate dissolvable in a selective etch;

a microstructure formed on said first substrate;

a trench surrounding said microstructure on said first substrate;

a bonding area on said first substrate surrounding said microstructure and said trench;

a second substrate having raised areas bonded to selected areas of said microstructure and to said bonding area on said first substrate; and said microstructure and said second substrate having greater resistance to said selective etch than said first substrate, said raised areas of said second substrate bonded to said bonding area protecting said microstructure from said selective etch during a process of dissolving said first substrate in said selective etch.

2. The etch control seal of claim 1, wherein said microstructure and said bonding area comprise a doped layer on said first substrate, said etch extending through said doped layer.

3. The etch control seal of claim 2, wherein said bonding area comprises a ring on said first substrate around said microstructure, wherein said ring is defined by trenches on both sides of said ring extending through said doped layer.

4. The etch control seal of claim 3, wherein said ring has greater resistance to said selective etch than said first substrate.

5. A bonded assembly for a microstructure fabrication process, comprising:

a first substrate comprising a material that dissolves in a selective etch;

a structure formed atop said first substrate;

a bonding area formed atop said first substrate and surrounding said structure, said bonding area having greater resistance to said selective etch than said first substrate; and a trench surrounding and separating said structure from said bonding area on said first substrate; and a second substrate bonded to selected areas of said structure and to said bonding area on said first substrate, said second substrate having greater resistance to said selective etch than said first substrate, said bonding area bonded to said second substrate protecting said structure from said selective etch during a process of dissolving said first substrate in said selective etch.

6. The bonded assembly of claim 5, wherein said structure formed atop said first substrate has greater resistance to said selective etch than said first substrate.

7. The etch control seal of claim 5, wherein said second substrate includes raised areas for bonding with said selected areas of said microstructure and said bonding area of said first substrate.

8. The bonded assembly of claim 7, wherein said trench separating said structure and said bonding area extends to said first substrate material that dissolves in said selective etch.

9. The bonded assembly of claim 8, wherein said bonding area is further defined by an additional trench surrounding said bonding area, said additional trench extending to said first substrate material that dissolves in said selective etch.

10. The bonded assembly of claim 9, wherein said structure and said bonding area are formed from a layer atop said first substrate having greater resistance to said selective etch than the rest of said first substrate.

11. A bonded assembly for a microstructure fabrication process, comprising:

a first substrate comprising a material that dissolves in a selective etch;

a microstructure formed atop said first substrate;

a bonding area formed atop said first substrate and surrounding said microstructure, said bonding area having greater resistance to said selective etch than said first substrate; and a trench surrounding and separating said microstructure from said bonding area on said first substrate;

a second substrate having greater resistance to said selective etch than said first substrate, said second substrate having raised areas for bonding with selected areas of said microstructure and said bonding area of said first substrate; and said second substrate bonded to said selected areas of said microstructure and to said bonding area of said first substrate, said bonding area bonded to said raised areas of said second substrate protecting said microstructure from said selective etch during a process of dissolving said first substrate in said selective etch.

12. The bonded assembly of claim 11, wherein said microstructure formed atop said first substrate has greater resistance to said selective etch than said first substrate.

13. The bonded assembly of claim 12, wherein said trench separating said microstructure and said bonding area extends to said first substrate material that dissolves in said selective etch.

14. The bonded assembly of claim 13, wherein said bonding area is further defined by an additional trench surrounding said bonding area, said additional trench extending to said first substrate material that dissolves in said selective etch.

15. The bonded assembly of claim 14, wherein said microstructure and said bonding area are formed from a layer atop said first substrate having greater resistance to said selective etch than the rest of said first substrate.

* * * * *